United States Patent [19]
Nishiguchi et al.

[11] Patent Number: 5,140,555
[45] Date of Patent: Aug. 18, 1992

[54] SEMICONDUCTOR INTEGRATED DEVICE HAVING UNIFORM NOISE BETWEEN A PAIR OF UNDECIDED VOLTAGE PORTIONS

[75] Inventors: Tadao Nishiguchi, Kawasaki; Takeo Tatematsu, Yokohama; Yoshinori Kasuta, Kawasaki, all of Japan

[73] Assignee: Fujitsu Limited, Kawasaki, Japan

[21] Appl. No.: 449,204

[22] Filed: Dec. 12, 1989

[30] Foreign Application Priority Data

Dec. 13, 1988 [JP] Japan ................. 63-312799

[51] Int. Cl.$^5$ .................................. G11C 7/02
[52] U.S. Cl. ........................... 365/206; 365/190; 365/208; 357/51
[58] Field of Search ............ 365/206, 207, 208, 190; 357/45, 68, 51

[56] References Cited

U.S. PATENT DOCUMENTS

| | | | |
|---|---|---|---|
| 4,291,394 | 9/1981 | Nakano et al. | 365/206 |
| 4,914,502 | 4/1990 | Lebowitz et al. | 357/68 |
| 4,916,661 | 4/1990 | Nawaki et al. | 365/190 |
| 4,922,459 | 5/1990 | Hidaka | 365/206 |

FOREIGN PATENT DOCUMENTS

| | | | |
|---|---|---|---|
| 0197639A3 | 10/1986 | European Pat. Off. | |
| 2553591 | 11/1975 | Fed. Rep. of Germany. | |
| 58-111183 | 7/1983 | Japan | 365/206 |
| 62-256297 | 11/1987 | Japan | 365/206 |
| 63-249997 | 10/1988 | Japan | 365/206 |
| 2112568 | 11/1982 | United Kingdom. | |

OTHER PUBLICATIONS

"A 70 ns 256K DRAM with Bit-Line Shield", Koichiro Mashiko, et al, 8107 IEEE Journal of Solid-State Circuits, SC-19(1984) Oct., No. 5, New York, pp. 591–596.

*Primary Examiner*—Joseph E. Clawson, Jr.
*Attorney, Agent, or Firm*—Armstrong, Nikaido, Marmelstein, Kubovcik & Murray

[57] ABSTRACT

In a semiconductor integrated device having floating voltage portion pairs, a signal line crossing over or under the floating voltage portion pairs, and a non-floating voltage portion, a noise source equivalent to the signal line is provided between the floating voltage pairs and the non-floating voltage portion.

7 Claims, 9 Drawing Sheets

Fig. 4(b)
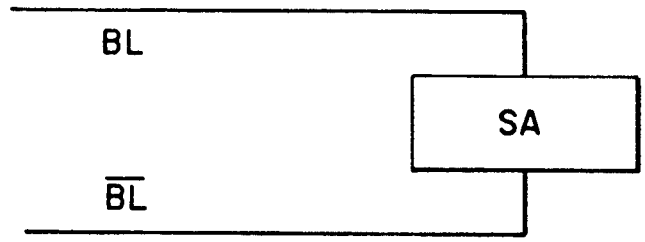
Fig. 4(c)
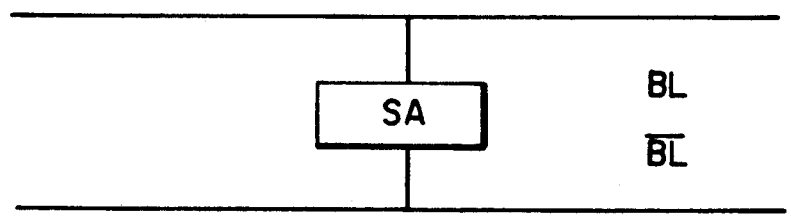
Fig. 4(d)

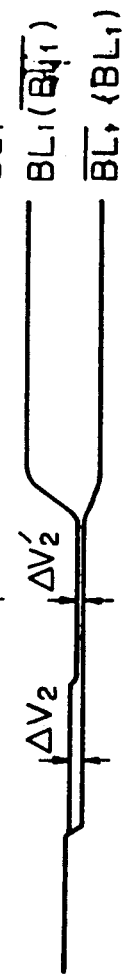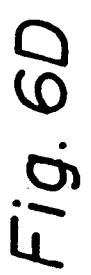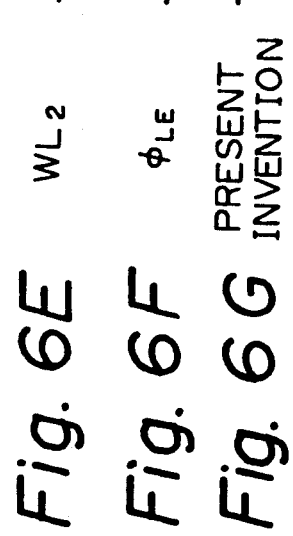
Fig. 6A
Fig. 6B
Fig. 6C
Fig. 6D
Fig. 6E
Fig. 6F
Fig. 6G PRESENT INVENTION
Fig. 6H PRIOR ART

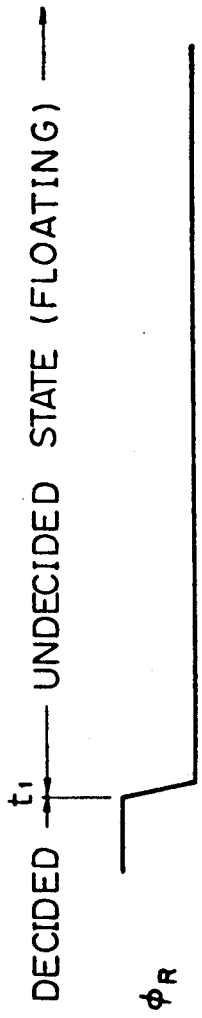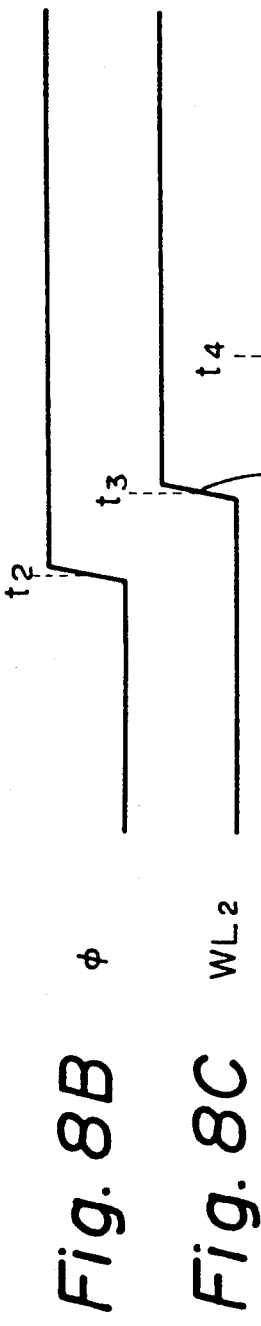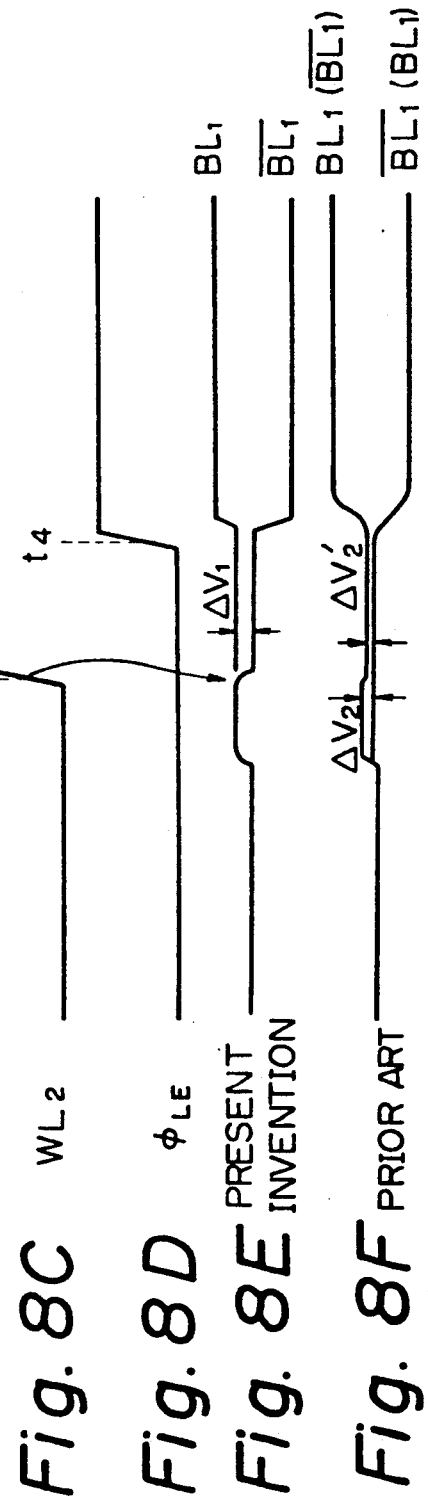

SEMICONDUCTOR INTEGRATED DEVICE HAVING UNIFORM NOISE BETWEEN A PAIR OF UNDECIDED VOLTAGE PORTIONS

BACKGROUND OF THE INVENTION

1. Field of the Invention

The present invention relates to a semi-conductor integrated device such as a dynamic metal-insulator-semiconductor (MIS) random access memory (RAM) having a plurality of pairs of undecided voltage portions which are in an undecided (floating) state for a certain time, and a plurality of sense amplifiers for amplifying a small difference in potential between each pair of undecided (floating) voltage portions.

2. Description of the Related Art

Recently, the integration and fining of the structure of a semiconductor integrated device such as a MIS memory device has become greater, and this has given rise to serious problems with regard to the conductor-spacing capacities between internal connections.

For example, in a MIS memory device, a pair of undecided (floating) voltage portions, such as a pair of folded bit lines which are in an undecided state, i.e., in a floating state, for a certain time are provided, and a small difference in potential therebetween corresponding to a content of a memory cell is amplified by a sense amplifier for such a time to generate the content therefrom. In this case, an operation clock signal line crosses over or down the bit lines. Therefore, conductor-spacing capacities exist between one of the bit lines and the operation clock signal line and between the other bit line and the operation clock signal line, and in this case, the two conductor-spacing capacities are the same.

On the other hand, a decided (non-floating) voltage portion, such as a power supply line for the sense amplifier, may be arranged near the bit lines. Here too conductor-spacing capacities exist between one of the bit lines and the power supply line and between the other of the bit lines and the power supply line. In this case, however, the two capacities are different from each other.

Thus, in an undecided (floating) state of the bit lines, even when the potential at the operation clock signal line is changed, a small difference in potential occurs between the bit lines, due to the difference in capacity of the bit lines with respect to the power supply line. Therefore, when a difference in potential corresponding to the content of a memory cell is added to the above-mentioned difference in potential between the bit lines, the sense amplifier may be erroneously operated. This will be discussed later in detail.

SUMMARY OF THE INVENTION

Therefore, an object of the present invention is to provide a semiconductor integrated device in which an erroneous operation, caused by noise due to the conductor-spacing capacities, does not occur.

According to the present invention, in a semiconductor integrated device having undecided (floating) voltage portion pairs, a signal line crossing over or under the undecided (floating) voltage portion pairs, and a decided (non-floating) voltage portion, a noise source equivalent to the signal line is provided between the undecided (floating) voltage pairs and the decided (non-floating) voltage portion. As a result, the conductor-spacing capacity between one undecided (floating) voltage portion of the outer side pair opposing to the decided (non-floating) voltage portion and the peripheral conductors thereof is substantially the same as the conductor-spacing capacity between the other undecided (floating) voltage portion of the above-mentioned outer side pair and the peripheral conductors thereof. Therefore, even when the undecided (floating) voltage portions are in an undecided (floating) state and the potential at the signal line is changed, there is no substantial difference in potential between the undecided (floating) voltage portions of the outer side pair, and therefore, sense amplifiers for sensing the potentials at the undecided (floating) voltage portions are not erroneously operated.

In another modification, instead of providing the above-mentioned noise source, the conductor-spacing capacity between one of the outer side undecided (floating) voltage portion pair and the signal line is different from that of the other of the outer side undecided (floating) voltage portion pair and the signal line.

BRIEF DESCRIPTION OF THE DRAWINGS

The present invention will be more clearly understood from the description as set forth below, with reference to the accompanying drawings, wherein;

FIGS. 6A through 6H are timing diagrams showing the operation of the circuit of FIG. 4.

FIGS. 8A through 8F are timing diagrams showing the operation of the circuit of FIG. 7.

DESCRIPTION OF THE EMBODIMENT

Before the description of the embodiments, a prior art semiconductor integrated device will be described with reference to FIGS. 1, 2A, and 2B.

Figure 1:
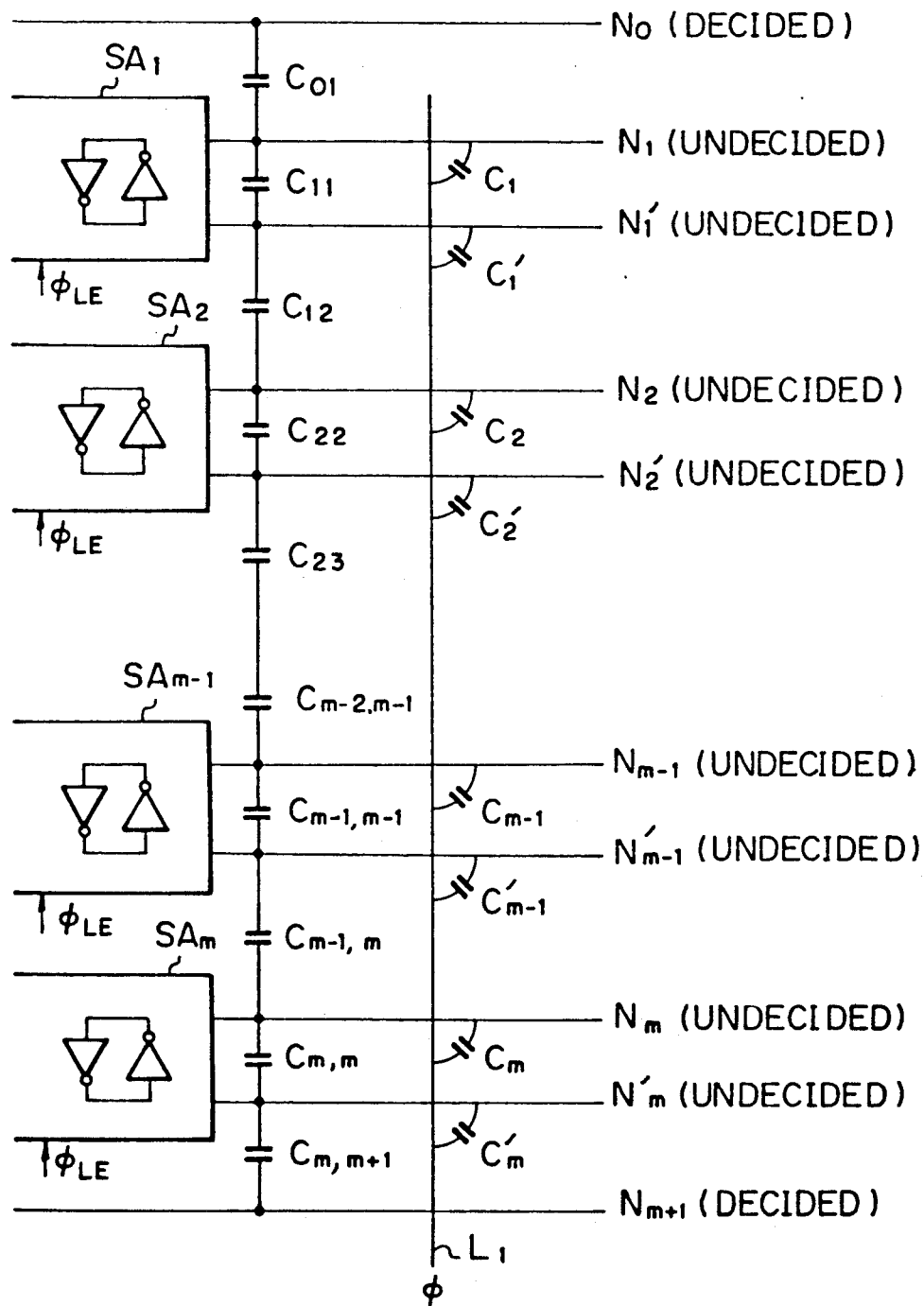
FIG. 1 is a circuit diagram illustrating a prior art semiconductor integrated device.

In FIG. 1, a plurality of pairs of undecided (floating) $N_m$ voltage portions $N_1$, $N_1'$; $N_2$, $N_2'$; . . . ; $N_{m-1}$, $N_{m-1}'$, $N_m$ are connected to sense amplifiers $SA_1$, $SA_2$, . . . , $SA_{m-1}$, $SA_m$ as differential amplifier stages respectively. The undecided (floating) voltage portions are in an undecided (floating) state for a first time, and in a decided (non-floating) state for a second time. For example, for the second time, the potentials at the undecided (floating) voltage portions are connected by turning ON the switching transistors (not shown) to a power supply line such as $V_{cc}$ or GND, and thus in this case are decided (non-floating). Conversely, for the first time, the switching transistors are turned OFF, so that the undecided (floating) voltage portions are electrically disconnected from the power supply, i.e., are in a floating state.

For example, for the above-mentioned second time, a small difference in potential is generated between a pair of the undecided (floating) voltage portions $N_1$ and $N_1'$, and thereafter, this difference is amplified by the sense amplifier $SA_1$. Note that the sense amplifiers $SA_1$ to $SA_m$, are operated by a latch enable signal $\phi_{LE}$, conductor-spacing capacities $C_{11}, C_{12}, C_{22}, C_{23}, \ldots, C_{m-2, m-1}, C_{m-1, m-1}, C_{m-1, m}, C_{m, m}$ exist between the undecided (floating) voltage portions.

A line $L_1$ for an operation clock signal $\phi$ is provided on the undecided (floating) voltage portions and therefore, conductor-spacing capacities $C_1, C_1', C_2, C_2', \ldots, C_{m-1}, C_{m-1}', C_m, C_m'$ exist between the line $L_1$ and the undecided (floating) voltage portions.

Figure 2A:
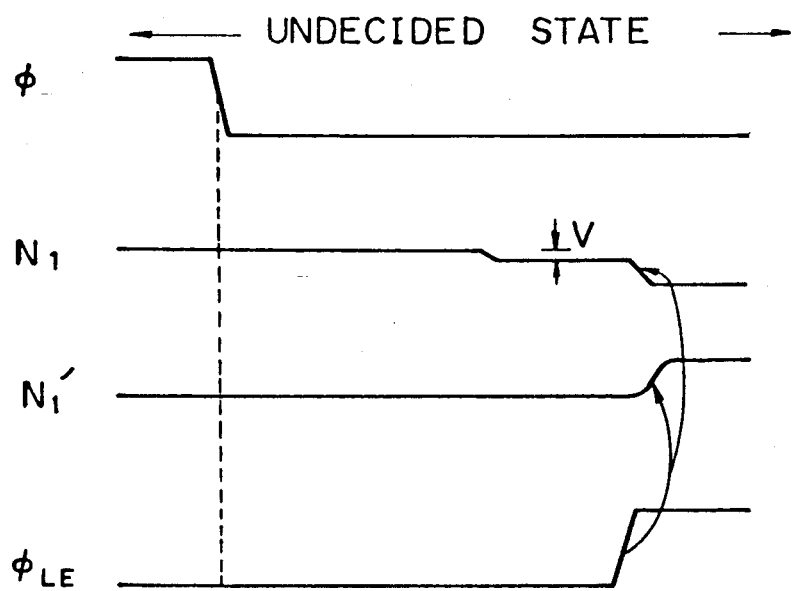
FIGS. 2A and 2B are timing diagrams showing the operation of the circuit of FIG. 1.
Figure 2B:
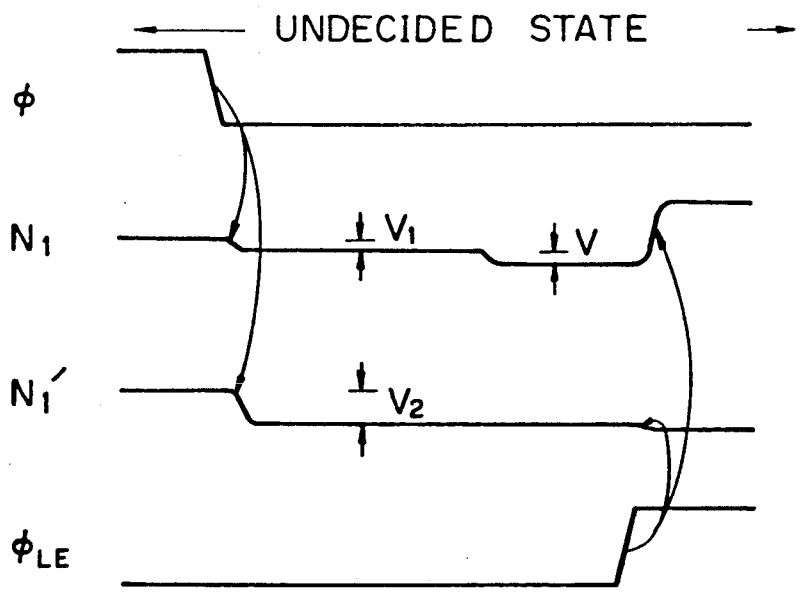

Decided (non-floating) voltage portions $N_0$ and $N_{m+1}$ are provided in the outer region of the undecided (floating) voltage portions to supply power supply voltages to the senser amplifiers $SA_1, SA_2, \ldots, SA_{m-1}, SA_m$, and therefore, a conductor-spacing capacity $C_{01}$, exists between the decided (non-floating) voltage portion $N_0$ and the undecided (floating) voltage portion $N_1$, and a conductor-spacing capacity $C_{m, m+1}$ also exists between the decided (non-floating) voltages portion $N_{m+1}$ and the undecided (floating) voltage portion node $N_m'$.

Where the conductor-spacing capacities are neglected, the operation of the undecided (floating) voltage portions, such as $N_1$ and $N_1'$ is shown in FIG. 2A. That is, even when the clock signal $\phi$ is changed from a high level to a low level, the potentials at the voltage portions $N_1$ and $N_1'$ do not change. In practice, however, as shown in FIG. 2B, when the clock signal $\phi$ is changed from a high level to a low level, the potentials at the voltage portions $N_1$ and $N_1'$ are both reduced. In this case, a noise $V_1$ received by the outermost floating voltage portion $N_1$ is affected by the conductor-spacing capacity $C_{01}$ of the non-floating voltage portion $N_0$, and a noise $V_2$ received by the floating voltage portion $N_1'$ adjacent to the floating voltage portion $N_1$ is affected by the conductor-spacing capacity between the floating voltage portion $N_1'$ having the floating voltage portion $N_2$. Therefore, the noise $V_1$ is smaller than the noise $V_2$, and as a result, a difference in potential between the floating voltage portions $N_1$ and $N_1'$ is generated, and therefore, when a normal difference V in potential satisfies $V < V_2 - V_1$, or when $|V_2 - V_1 - V|$ is smaller than the sensing ability of the sense amplifier $SA_1$, the sense amplifier $SA_1$ is erroneously operated by the latch enable signal $\phi_{LE}$. This problem also arises in the floating voltage portions $N_m$ and $N_m'$, but does not occur at the intermediate floating voltage portions $N_2, N_2', \ldots, N_{m-1}, N_{m-1}'$.

Figure 3:
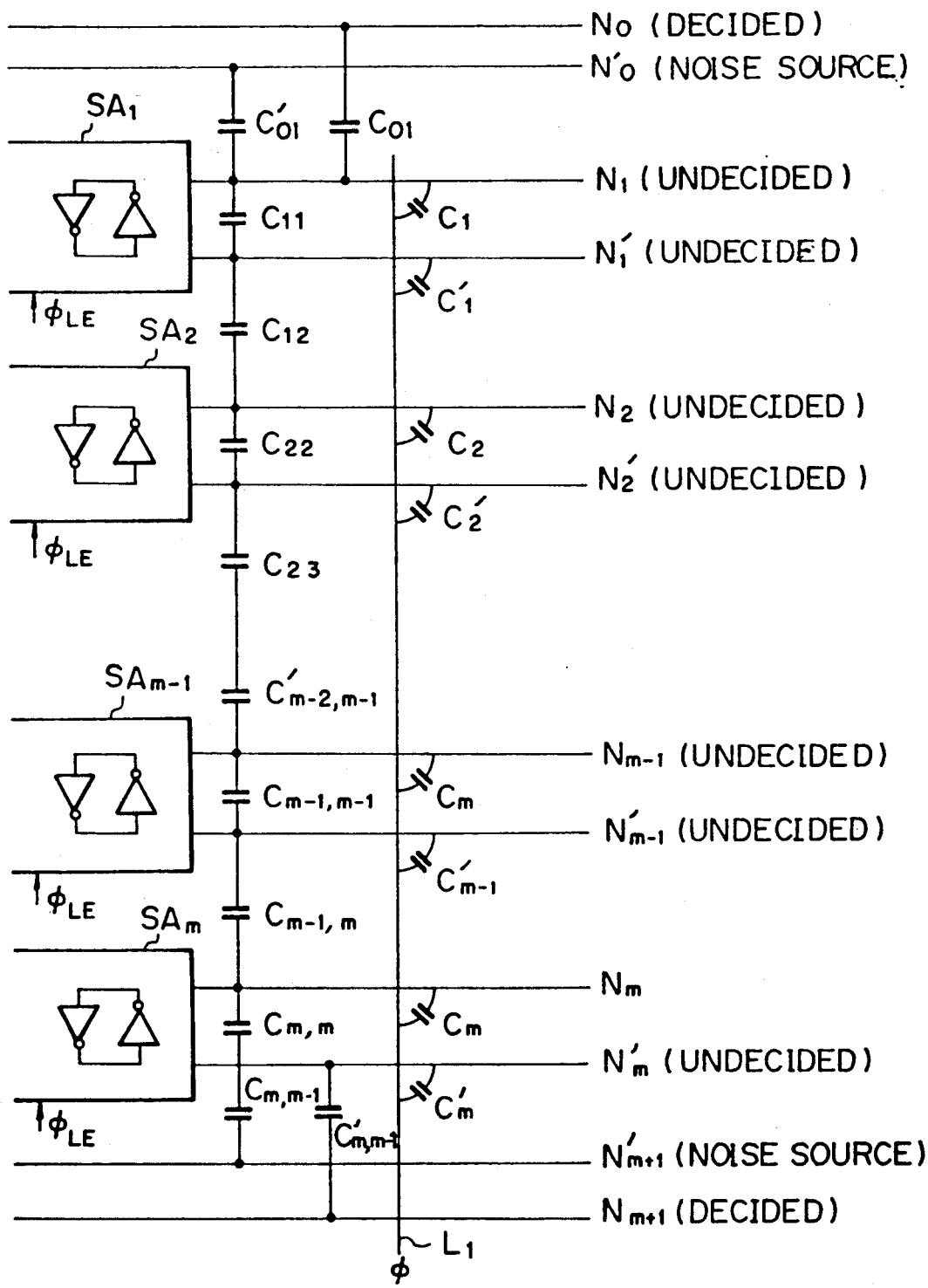
FIG. 3 is a circuit diagram illustrating a first embodiment of the semiconductor integrated device according to the present invention.

In FIG. 3, which illustrates a first embodiment of the semiconductor integrated device according to the present invention, noise sources $N_0'$ and $N_{m+1}'$ are added to the elements of FIG. 1. The noise source $N_0'$ is provided between the outermost undecided (floating) voltage portion $N_1$ and the non-floating voltage portion $N_0$, and the potential at the noise source $N_0'$ is the same as or equal to the potential of the clock signal $\phi$ when the (floating) voltage portions $N_1, N_1', N_2, N_2', \ldots N_{m-1}, N_{m-1}', N_m, N_m'$ are (floating). For example, the noise source $N_0'$ can be connected to the line $L_1$. Similarly, the noise source $N_{m+1}'$ is provided between the outermost undecided (floating) voltage portion $N_m'$ and the (non-floating) voltage portion $N_{m+1}$, and the potential at the noise source $N_m'$ is the same as or equal to the potential of the clock signal $\phi$ when the (floating) voltage portions $N_1, N_1', N_2, N_2' \ldots, N_{m-1}, N_{m-1}', N_m, N_m'$ are (floating). For example, the noise source $N_{m+1}$ can be also connected to the line $L_1$.

In FIG. 3, the capacity coupling between the outermost voltage portion $N_1$ (or $N_m'$) and the non-floating voltage portion $N_0$ (or $N_{m+1}$) becomes weak, but the capacity coupling between the outermost voltage portion $N_1$ (or $N_m'$) and the added noise source $N_0'$ (or $N_{m+1}'$) becomes strong. Therefore, each of the pair of outermost floating voltage portions $N_1$ and $N_1'$ (or $N_m$ and $N_m'$) receives an equivalent noise from the clock signal $\phi$, and as a result, the noises $V_1$ and $V_2$ of FIG. 2B satisfy $V_1 \simeq V_2$. Therefore, the sense amplifier $SA_1$ (or $SA_m$) cannot be erroneously operated.

Figure 4A:
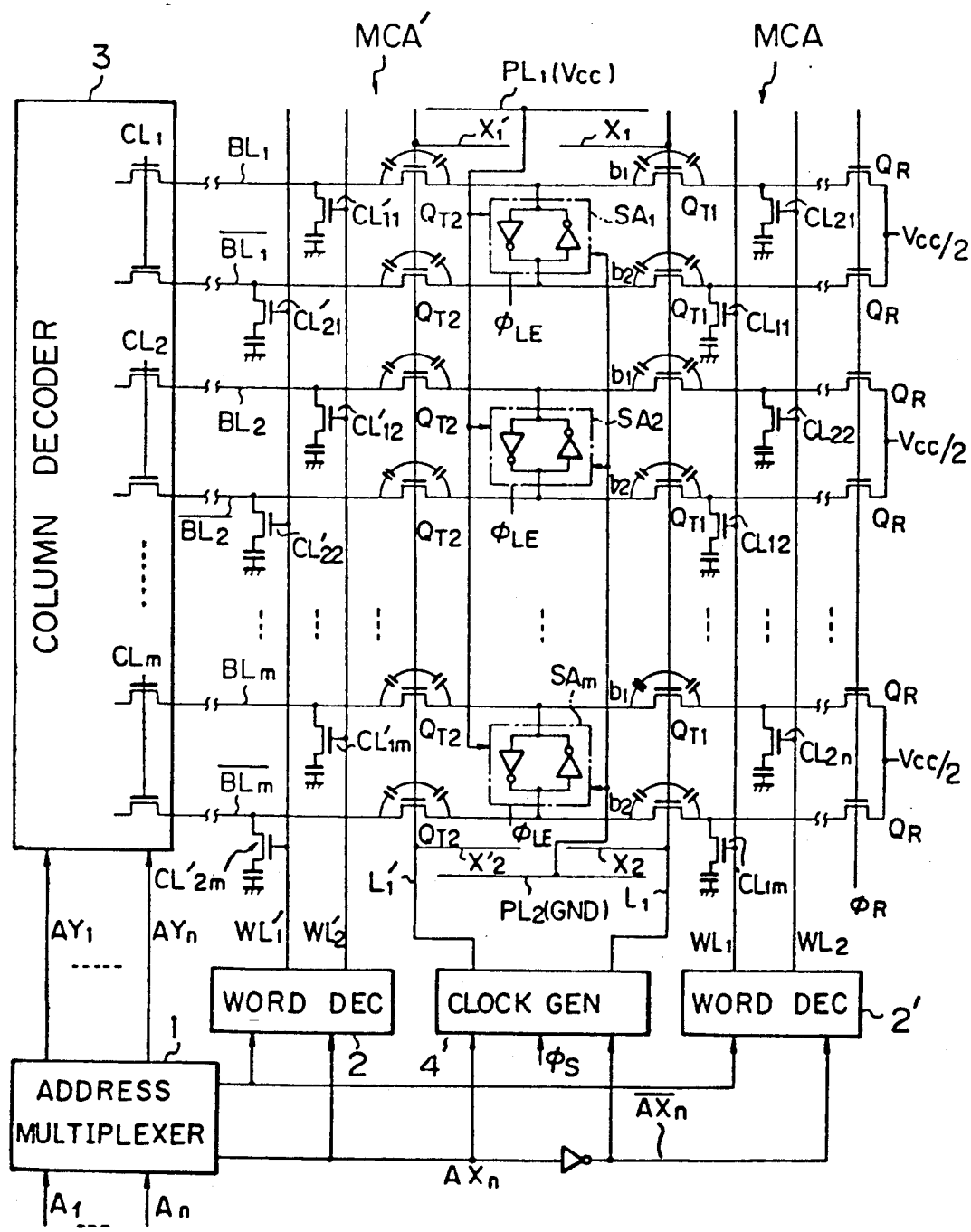
FIG. 4($a$) is a circuit diagram illustrating a second embodiment of the semiconductor integrated device according to the present invention and FIGS. 4($b$)–4($d$) show circuits with shared and/or folded bit lines.
Figure 5:
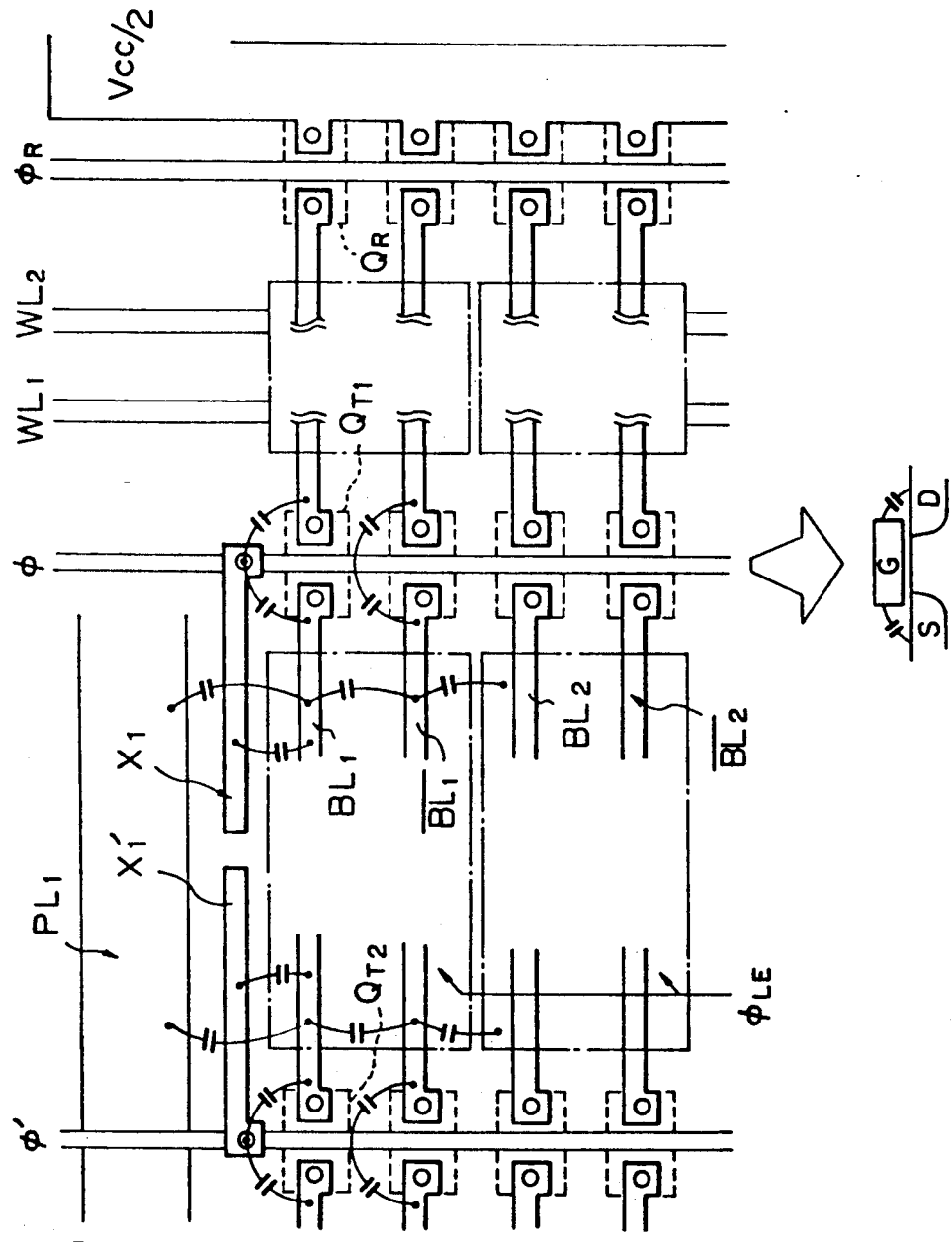
FIG. 5 is a partial plan view of FIG. 4.

FIG. 4(a) illustrates a second embodiment of the semiconductor integrated device according to the present invention, and FIG. 5 is a partial plan view of FIG. 4(a). FIG. 4(b) shows a shared-bit line type, FIG. 4(c) shows a folded-bit line type and FIG. 4(d) shows a folded bit line type and shared bit line type. In FIG. 4(a), a MIS memory of a folded bit line type as well as a shared-bit line type, having two memory cell array blocks MCA and MCA' is illustrated. In FIG. 4(a), reference numeral 1 designates an address multiplexer for receiving address signals $A_1$ though $A_n$ from the address buffer (not shown), to generate multiple X-address signals $AX_1$ through $AX_n$ and Y-address signals $AY_1$ through $AY_n$. Reference numerals 2 and 2' designate word decoders for selecting one of the word lines $WL_1, WL_2, \ldots (WL_1', WL_2', \ldots)$ of the memory cell arrays MCA and MCA', respectively, in accordance with the X-address signals $AX_1$ through $AX_n$. Reference numeral 3 designates column decoders for selecting one pair of the word lines $BL_1, BL_1; BL_2, BL_2; \ldots BL_m, BL_m$ of the memory cell arrays MCA and MCA' in accordance with the Y address signals $AY_1$ through $AY_n$. Reference 4 designates a clock generator which receives the X address signals $AX_n$ and $AX_n$ and a clock signal $\phi_s$ from the RAS clock system (not shown) and generates clock signal $\phi$ and $\phi'$.

Also, the bit lines $BL_1, BL_1; BL_2, BL_2; \ldots, BL_m, BL_m$ are connected, via transfer gates $Q_{T1}$ and $Q_{T2}$, to sense amplifiers $SA_1, SA_2, \ldots, SA_n$, respectively. Further, a power supply source $V_{cc}/2$ is connected, via precharging gates $Q_R$, to the bit lines $BL_1, BL_1; BL_2, BL_2, \ldots, BL_m, BL_m$. Further one-transistor one-capacitor type memory cells $CL_{11}, CL_{12}, \ldots, CL_{11}', CL_{12}', \ldots$ are connected between the bit lines $BL_1, BL_1, BL_2, BL_2, \ldots, BL_m, BL_m$, and the word lines $WL_1, WL_2, \ldots, WL_1', WL_2', \ldots$ Each of the bit lines $BL_1, BL_1, BL_2, BL_2, \ldots, BL_m, BL_m$ serves as a floating voltage portion.

Also, power supply lines $PL_1$ and $PL_2$ are provided for the sense amplifiers $SA_1, SA_2, \ldots,$ and $SA_m$. These power supply lines serve as non-floating voltage portions.

According to the present invention, noise sources $X_1$ and $X_1'$ are provided between the outermost bit line $BL_1$ (undecided (floating) voltage portion) and the power supply line $PL_1$ ((non-floating) voltage portion), and noise sources $X_2$ and $X_2'$ are provided between the outermost bit line $BL_m$ floating voltage portion and the power supply line $PL_2$ (non-floating voltage portion)

The operation of the circuit of FIG. 4(a) will be explained with reference to FIGS. 6A through 6H. Note that only the bit lines $BL_1$ and $BL_1$ are illustrated. That is, at an initial stage, all of the bit lines $BL_1$ and $BL_1$ are reset by a reset signal $\phi_R$, as shown in FIG. 6A, to charge the bit lines $BL_1$ and $BL_1$ at $V_{cc}/2$ as shown in FIG. 6G. Namely, in this case, although the bit lines $BL_1$ and $BL_1$ are the floating voltage portions, the bit lines $BL_1$ and $\overline{BL}_1$ are in a non-floating state. Thereafter, at a time $t_1$, when the reset signal $\phi_R$ becomes low, the bit lines $BL_1$ and $\overline{BL}_1$ are separated from the power supply voltage $V_{cc}/2$, and accordingly, reach an undecided (floating) state. Next, at a time $t_2$ when the clock signals $\phi'$ and $\phi$ are changed from a high level to a low level, the bit lines $BL_1$ and $\overline{BL}_1$ are separated from the sense amplifier $SA_1$, and in this case, the same noise is generated in the bit line $BL_1$ and $\overline{BL}_1$ to reduce the potentials thereof. Next, at a time $t_3$, to select the memory cell $CL_{21}$, the clock signal $\phi_s$ generated from the RAS clock system (not shown) is changed from a high level to a low level and the clock signal $\phi$ is changed from a low level to a high level, and thereafter, at a time $t_4$, the word line $WL_2$ is made high by the word decoder 2. As a result, a small difference in potential is generated between the bit lines $BL_1$ and $\overline{BL}_1$, and at a time $t_5$ this difference is amplified by the sense amplifier $SA_1$ activated by the high level of the latch enable signal $\phi_{LE}$.

Note that, when different noises are generated by the clock signals $\phi'$ and $\phi$ in the bit lines $BL_1$ and $\overline{BL}_1$ as in the prior art, this generates a difference $\Delta V_2$ in the potential at this stage. As a result, at a stage when the memory cell $C_{21}$ is selected, the difference $\Delta V_2$ in potential between the bit lines $BL_1$ and $\overline{BL}_1$ may be small or opposite to the content of the memory cell $CL_{21}$, and accordingly, the sense amplifier $SA_1$ may be erroneously operated.

Figure 7:
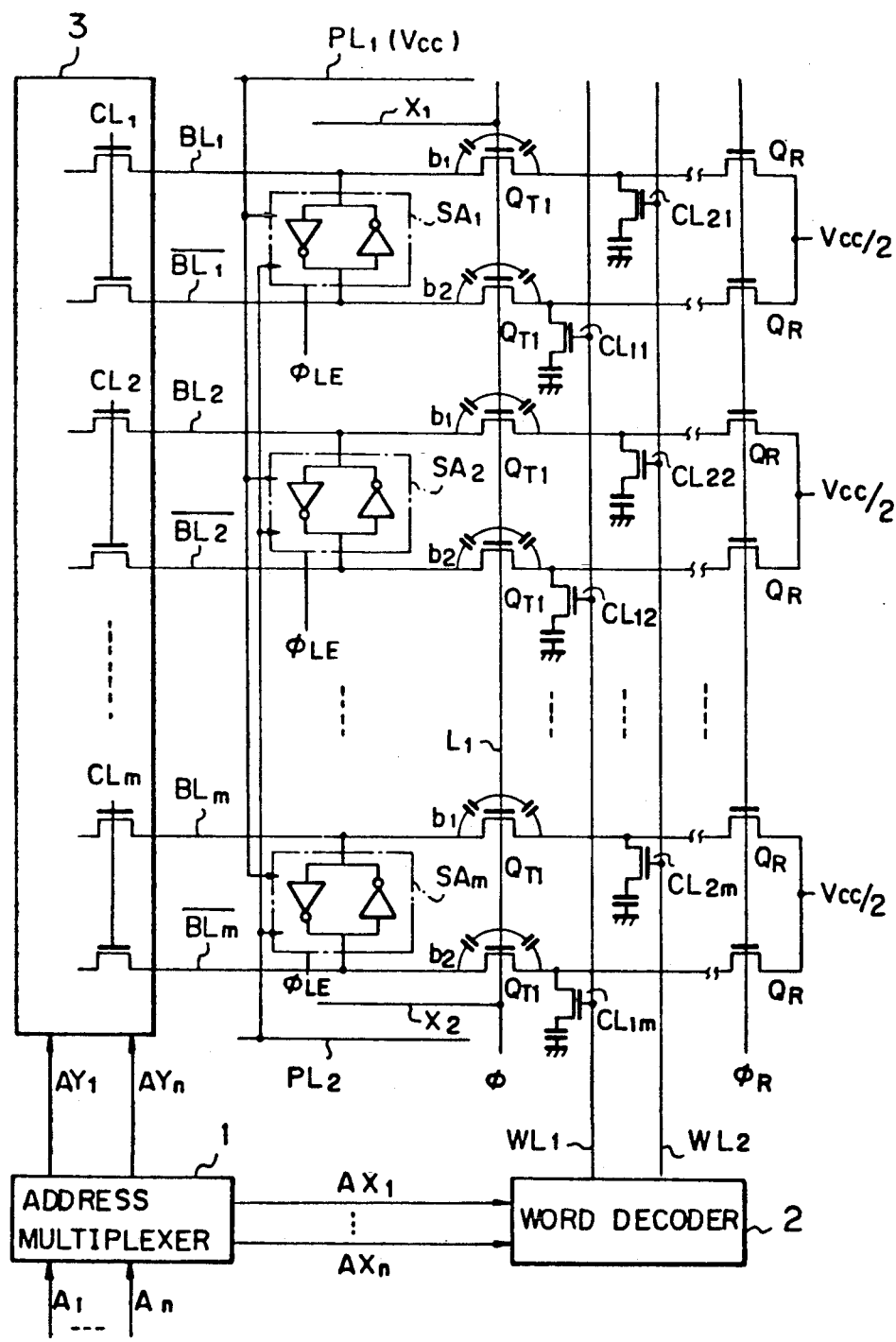
FIG. 7 is a circuit diagram showing a third embodiment of the semiconductor integrated device according to the present invention.

In FIG. 7, which illustrates a third embodiment of the semiconductor integrated device according to the present invention, a MIS memory of the folded-bit line type having a memory cell array block MCA is illustrated. Therefore, in FIG. 7, the word decoder 2' of FIG. 4(a) is not provided.

The operation of the circuit of FIG. 7, which is similar to that of FIG. 4(a), will be explained with reference to FIGS. 8A through 8F. Namely, at an initial stage, all of the bit lines $BL_1$ and $\overline{BL}_1$, are reset by the reset signal $\phi_R$, as shown in FIG. 8A, to change the bit lines $BL_1$ and $\overline{BL}_1$ at $V_{cc}/2$ shown in FIG. 8E. Also, in this case, although the bit lines $BL_1$ and $\overline{BL}_1$ are the floating voltage portions, the bit lines $BL_1$ and $\overline{BL}_1$ are in a non-floating state. Thereafter, at a time $t_1$ when the reset signal $\phi_R$ becomes low, the bit lines $BL_1$ and $\overline{BL}_1$ are separated from the power supply voltage $V_{cc}/2$, and accordingly, reach an undecided (floating) state. Next, at a time $t_2$, to select the memory cell $CL_{21}$, the clock signal $\phi$ generated from the RAS clock system (not shown) is changed from a low level to a high level, and in this case, the same noise is generated in the bit line $BL_1$ and $\overline{BL}_1$ to increase the potentials thereof. Thereafter, at a time $t_3$ the word line $WL_2$ is made high by the word decoder 2. As a result, a small difference in potential is generated between the bit lines $BL_1$ and $\overline{BL}_1$, and at a time $t_4$, this difference is amplified by the sense amplifier $SA_1$ activated by the high level of the latch enable signal $\phi_{LE}$.

Note that, in the above-mentioned embodiments, the noise sources $X_1$ ($X_1'$) and $X_2$ ($X_2'$) are connected to the clock signal line $L_1$ ($L_2$), but such noise sources can be separated therefrom. In this case, the potentials at the noise sources $X_1$ ($X_1'$) and $X_2$ ($X_2'$) are equivalent to the clock signal $\phi$ ($\phi'$) at least when the bit lines $BL_1$, $\overline{BL}_1$ are in an undecided (floating) state.

Note that, in the embodiments of FIGS. 4 and 7, the noise sources $X_1$ ($X_1'$) and $X_2$ ($X_2'$) are connected to the clock signal line $L_1$ ($L_1'$). This actually increases the conductor-spacing capacity between the bit line $BL_1$ and the clock signal line $L_1$ ($L_1'$) including the noise source $X_1$ ($X_1'$) and the conductor-spacing capacity between the bit line $BL_m$ and the clock signal line $L_1$ ($L_1'$). Therefore, instead of the noise sources, it is possible to unbalance the conductor-spacing capacity between the bit line $BL_1$ ($BL_m$) and the signal line $L_1$ ($L_1'$) and the conductor-spacing capacity between the bit line $\overline{BL}_1$ ($\overline{BL}_m$) and the signal line $L_1$ ($L_1'$). In this case, the former capacity is larger than the latter capacity. For example, this can be attained by enlarging the gate area of the transistor $Q_{T1}$ ($Q_{T2}$) located at the intersection of the bit line $BL_1$ ($BL_m$) and the signal line $L_1$ ($L_1'$).

As explained above, according to the present invention, an unbalance in potential between both sides of an outer side sense amplifier due to noise can be corrected, to thereby ensure an accurate operation of the sense amplifier, which improves the performance of the semiconductor integrated device. Note, it is possible to provide redundancy sense amplifiers and redundancy floating voltage portions instead of the noise source, but this remarkably increases the area occupied in the device, which is a disadvantage.

What is claimed is:

1. A semiconductor integrated device comprising:
   a plurality of signal line pairs which are in a floating state for a first time and in a non-floating state for a second time, lines of each pair of said signal line pairs being in parallel with each other;
   a plurality of sensing means each connected to one of said signal line pairs, for sensing a small difference in potential therebetween;
   a non-floating voltage portion arranged on an outer side of said signal line pairs;
   a signal line crossing said signal line pairs; and
   a noise means for inducing noise in said signal line to an outermost signal line of said signal line pairs, said noise means arranged between said non-floating voltage portion and an outer side pair of said signal line pairs, said noise means having a potential equivalent to that of said signal line.

2. A device as set forth in claim 1, wherein said noise means is connected to said signal line.

3. A device as set forth in claim 1, comprising one of a shared bit line type and folded bit line type MIS memory device,
   said signal line pairs comprising bit line pairs, and said non-floating voltage portion comprising a power supply line for supplying a power supply voltage to said sensing means.

4. A semiconductor integrated device comprising:
   a plurality of signal line pairs which are in a floating state for a first time and in a non-floating state for a second time, lines of each pair of said signal line pairs being in parallel with each other;
   a plurality of sensing means each connected to one of said signal line pairs, for sensing a small difference in potential therebetween;
   a non-floating voltage portion arranged on an outer side of said signal line pairs;
   a signal line crossing said signal line pairs; and
   a means for increasing a capacitance between an outermost signal line pair and said signal line larger than a capacitance between adjacent signal line pairs and said signal line.

5. A device as set forth in claim 4, comprising one of a shared bit line type and a folded bit line type MIS memory device,
   said signal line pairs comprising bit lines pairs said non-floating voltage portion comprising a power supply line for supplying a power supply voltage to said sensing means.

6. A dynamic semiconductor memory device comprising:
- a plurality of bit line pairs arranged in parallel;
- a plurality of sense amplifiers each connected to one of said bit line pairs;
- a plurality of dynamic memory cells connected to said bit line pairs;
- a precharge circuit, connected to said bit line pairs, for precharging said bit line pairs;
- a signal line crossing said bit line pairs;
- a plurality of transfer gate transistors, each connected between one of said sense amplifier and one bit line of said bit line pairs, said transfer gate transistors controlled by a signal generated on said signal line; and
- means, connected to said signal line, for increasing a conductor-spacing capacity between said signal line and an outermost bit line as compared with a conductor-spacing capacity between said signal line and each of the other bit lines, said means including a conductor extending in parallel to said outermost bit line of said bit line pairs.

7. A dynamic semiconductor memory device comprising:
- a plurality of bit line pairs of folded and shaped bit type arranged in parallel;
- a plurality of sense amplifiers, each connected to one of said bit line pairs;
- a plurality of dynamic memory cells connected to said bit line pairs;
- a precharge circuit, connected to said bit line pairs, for precharging said bit line pairs;
- two signal lines crossing said bit line pairs;
- two series of a plurality of transfer gate transistors, each connected between one of said sense amplifiers and one bit line of said bit line pairs, each series of said transfer gate transistors controlled by a signal generated on one of said signal lines; and
- means, connected to said signal lines, for increasing a conductor-spacing capacity between said signal lines and an outermost bit line as compared with a conductor-spacing capacity between said signal lines and each of the other bit lines, said means including a first conductor extending in parallel to a first outermost bit line of said bit line pairs, and a second conductor extending in parallel to a second outermost bit line of said bit line pairs, said first and second conductors electrically separate from each other.

* * * * *